United States Patent [19]

Isogai

[11] 4,456,979
[45] Jun. 26, 1984

[54] STATIC SEMICONDUCTOR MEMORY DEVICE

[75] Inventor: Hideaki Isogai, Higashikurume, Japan

[73] Assignee: Fujitsu Limited, Kawasaki, Japan

[21] Appl. No.: 343,155

[22] Filed: Jan. 27, 1982

[30] Foreign Application Priority Data

Jan. 29, 1981 [JP] Japan .................................. 56-11972

[51] Int. Cl.³ ................................................ G11C 7/02
[52] U.S. Cl. ................................................... 365/190
[58] Field of Search ........................................ 365/190

[56] References Cited

U.S. PATENT DOCUMENTS

4,398,268  8/1983  Toyoda ............................... 365/190
4,417,326  11/1983  Toyoda et al. ....................... 365/190

*Primary Examiner*—Stuart N. Hecker
*Attorney, Agent, or Firm*—Staas & Halsey

[57] ABSTRACT

A static semiconductor memory device comprises static memory cells respectively connected to a pair of word lines, and a pair of diodes. One end of each diode is connected to a corresponding one of the pair of bit lines, so as to absorb the electric currents from the bit lines, and the other end of each diode is commonly connected to a constant current source via a transistor which is controlled together with column-selecting transistors according to a column-selecting signal.

6 Claims, 7 Drawing Figures

STATIC SEMICONDUCTOR MEMORY DEVICE

BACKGROUND OF THE INVENTION

The present invention relates to a static semiconductor memory device in which erroneous writing in cells is prevented.

In a bipolar type static RAM (random access memory), memory cells are arranged at the intersections of word lines and pairs of bit lines. Each memory cell is formed by a flip-flop circuit including a pair of multi-emitter transistors, load resistors, and Schottky barrier diodes connected to the load resistors in parallel.

Recent increases in the capacity of static RAM's have led to increases in the resistance value of the load resistors. In a conventional static RAM, however, a problem arises when, for example, a memory cell $M_{11}$ is selected by selecting a word line $W_1$ and a column $B_1$ soon after a memory cell $M_{00}$ is selected by selecting a word line $W_0$ and a column $B_0$. In such a case, a memory cell $M_{01}$, connected to the word line $W_0$ and column $B_1$, is temporarily selected before the intended memory cell $M_{11}$ is selected. This is because column selection is generally faster than word line selection. In such a conventional static RAM, there is a possibility of erroneous writing in the selected cell $M_{11}$ as is explained below.

SUMMARY OF THE INVENTION

An object of the present invention is to provide a static semiconductor memory device in which erroneous writing in cells is prevented.

For the purpose of achieving the object of the present invention, a static semiconductor memory device, which includes static memory cells respectively connected to a pair of word lines and a pair of bit lines, further comprises a pair of unidirectional current elements, each having one end connected to one of the pair of bit lines, so as to absorb the electric current from the bit line. The other end of each unidirectional current element is commonly connected to a constant current source via a switching means which is switched by a column-selecting voltage.

Further features and advantages of the present invention will be apparent from the ensuing description with reference to the accompanying drawings to which, however, the scope of the invention is in no way limited.

DESCRIPTION OF THE PREFERRED EMBODIMENTS

Figure 1:
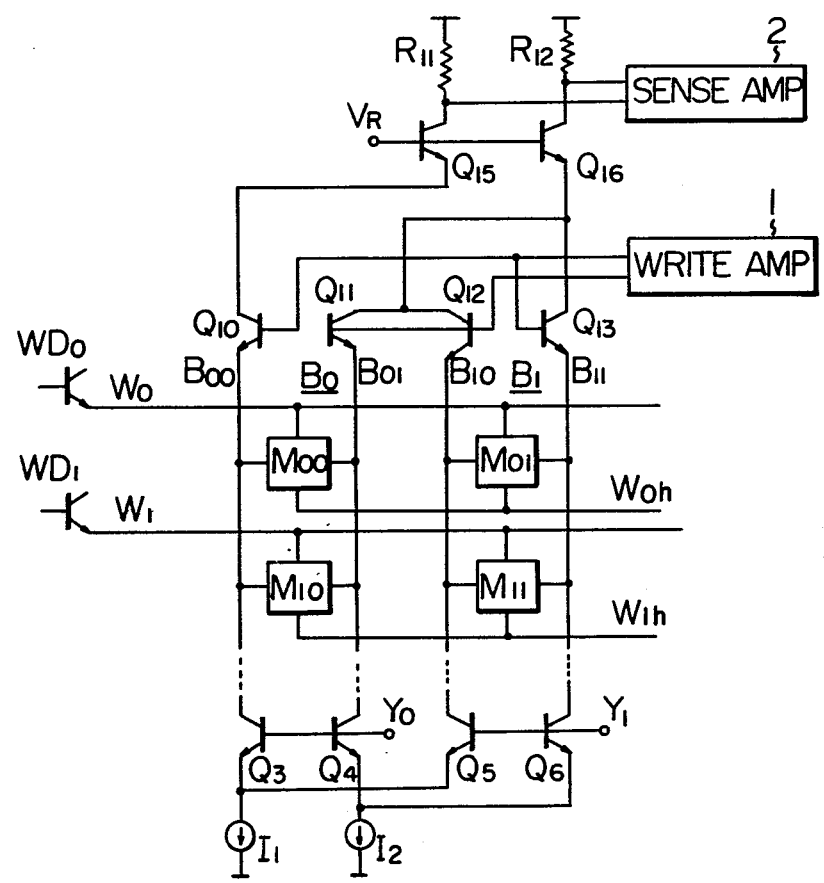
FIG. 1 is a block diagram of a conventional static RAM.

A conventional bipolar type static RAM comprises a plurality of memory cells $M_{00}$, $M_{01}$, ... arranged at the intersections of word lines $W_0$, $W_1$, ... and pairs of bit lines $B_{00}$ and $B_{01}$, $B_{10}$, and $B_{11}$, ..., as shown in FIG. 1. In FIG. 1, $W_{0h}$, $W_{1h}$, ... represent negative side word lines or hold lines; $WD_0$, $WD_1$, ... represent word drivers; $Q_3$ and $Q_4$ and $Q_5$ and $Q_6$ represent column-selecting transistors; $Y_0$, $Y_1$, ... represent column-selecting voltages; and $I_1$ and $I_2$ represent constant current sources. The pairs of bit lines $B_{00}$ and $B_{01}$, $B_{10}$ and $B_{11}$, ..., are connected to the emitters of bit drivers $Q_{10}$, $Q_{11}$, $Q_{12}$, and $Q_{13}$. The bases of the bit drivers $Q_{10}$, $Q_{11}$, $Q_{12}$, and $Q_{13}$ are connected to a write amplifier 1, and the collectors of the bit drivers $Q_{10}$, $Q_{11}$, $Q_{12}$, and $Q_{13}$ are connected via transistors $Q_{15}$ and $Q_{16}$ to a sense amplifier 2. The bases of the transistors $Q_{15}$ and $Q_{16}$ receive a reference voltage $V_R$, and the collectors of the transistors $Q_{15}$ and $Q_{16}$ are connected via load resistors $R_{11}$ and $R_{12}$ to electric sources.

Figure 2:
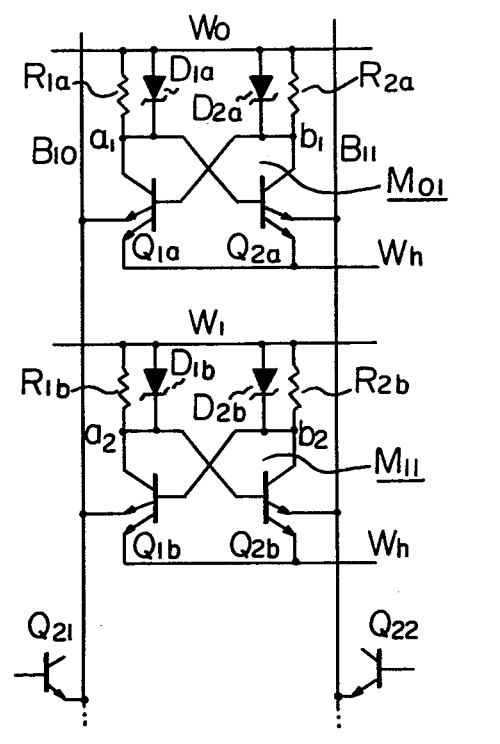
FIG. 2 is a circuit of memory cells included in the RAM shown in FIG. 1.

FIG. 2 is a detailed circuit diagram of the memory cells $M_{01}$ and $M_{11}$ shown in FIG. 1. As shown in FIG. 2, memory cells $M_{01}$, $M_{02}$ are formed by flip-flop circuits, each including load resistors $R_{1a}$, $R_{2a}$; $R_{1b}$, $R_{2b}$, Schottky barrier diodes $D_{1a}$, $D_{2a}$; $D_{1b}$, $D_{2b}$, and multi-emitter transistors $Q_{1a}$, $Q_{2a}$; $Q_{1b}$, $Q_{2b}$.

In the static RAM shown in FIGS. 1 and 2, a problem arises when, for example, the memory cell $M_{11}$ is selected by selecting the word line $W_1$ and the column $B_1$ soon after the memory cell $M_{00}$ is selected by selecting the word line $W_0$ and the column $B_0$. In such a case, the memory cell $M_{01}$, connected to the word line $W_0$ and the column $B_1$, is temporarily selected before the intended memory cell $M_{11}$ is selected. This is because column selection is generally faster than word line selection. In such a conventional static RAM, there is a possibility of erroneous writing in the selected cell $M_{11}$ as is explained below.

Figure 3A:
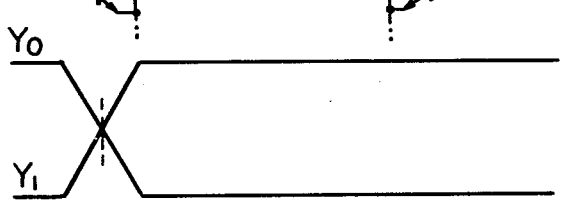
FIGS. 3A, 3B and 3C are waveform timing charts showing changes of potentials at the respective parts of the memory device shown in FIGS. 1 and 2.
Figure 3B:
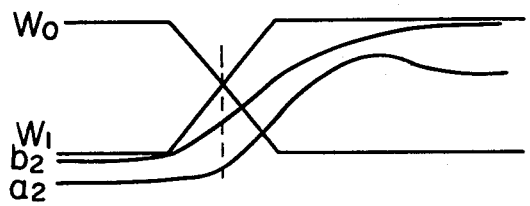
Figure 3C:
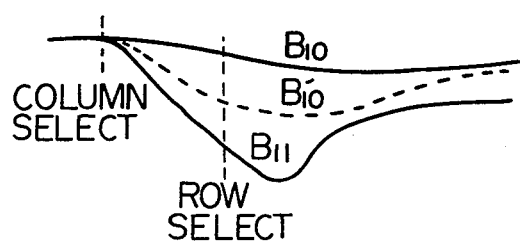

That is, suppose the write data is supplied so that, in each of the memory cells $M_{01}$ and $M_{11}$, the transistors $Q_{1a}$, $Q_{1b}$, on the left side in FIG. 2, are turned on and the transistors $Q_{2a}$, $Q_{2b}$, on the right side in FIG. 2, are turned off. A high (H) voltage level then is maintained at the points $b_1$, $b_2$ in the cells, and a low (L) voltage level then is maintained at the points $a_1$, $a_2$ in the cell. Since the transistors $Q_{1a}$, $Q_{1b}$ are in the "on" state, their collector currents flow through the high resistors $R_{1a}$, $R_{1b}$. Significant voltage drops across the resistors $R_{1a}$ and $R_{1b}$ turn on the Schottky barrier diodes $D_{1a}$, $D_{1b}$. On the other hand, since the transistors $Q_{2a}$, $Q_{2b}$ are in the "off" state, their collector currents do not flow through the high resistors $R_{2a}$, $R_{2b}$ and, therefore, the Schottky barrier diodes $D_{2a}$, $D_{2b}$ are in the off state. Accordingly, the impedance of the points $a_1$, $a_2$ is low while the impedance of the points $b_1$, $b_2$ is high. Therefore, when the row $W_1$ is selected, the potential at the point $a_2$ in the memory cell $M_{11}$ rises faster than that at the point $b_2$ in the memory cell $M_{11}$ as shown in FIG. 3B. Before the column is selected, both the bit lines $B_{10}$ and $B_{11}$ are clamped at a high voltage by clamp circuits $Q_{21}$ and $Q_{22}$, but selection of the column releases this clamping. Since the selecting speed on the column is faster than that on the word line, as shown in FIGS. 3A and 3B, the potential of the bit line $B_{10}$ is clamped by the memory cell $M_{01}$ and is maintained at a high level, while the potential of the bit line $B_{11}$ is maintained at a low level, as shown in FIG. 3C, as determined by the base potential of the transistor $Q_{13}$ (FIG. 1), so that not the word line $W_0$ but the word line $W_1$ is selected. However, the potential of the bit line $B_{10}$ is still kept high because of a capacitance attached to the bit line, and the potential of the bit line $B_{11}$ is maintained at a low level as determined by the transistor $Q_{13}$. In this circumstance, the potential difference between the point $a_2$ and the bit line $B_{10}$ is kept in the low bias voltage state, and the potential difference between the point $b_2$ and the bit line $B_{11}$ is kept in the high bias voltage state. Therefore in the case where the above difference resides between the bit lines $B_{10}$ and $B_{11}$, during the selection of the memory cell $M_{11}$ from the side of the word line $W_1$, the bit line $B_{10}$ is at a high level and the bit line $B_{11}$ is at a low level. Therefore, there is a possibility that the transistor $Q_{1b}$ may be turned off and the transistor $Q_{2b}$ may be turned on in the selected cell $M_{11}$.

Figure 4:
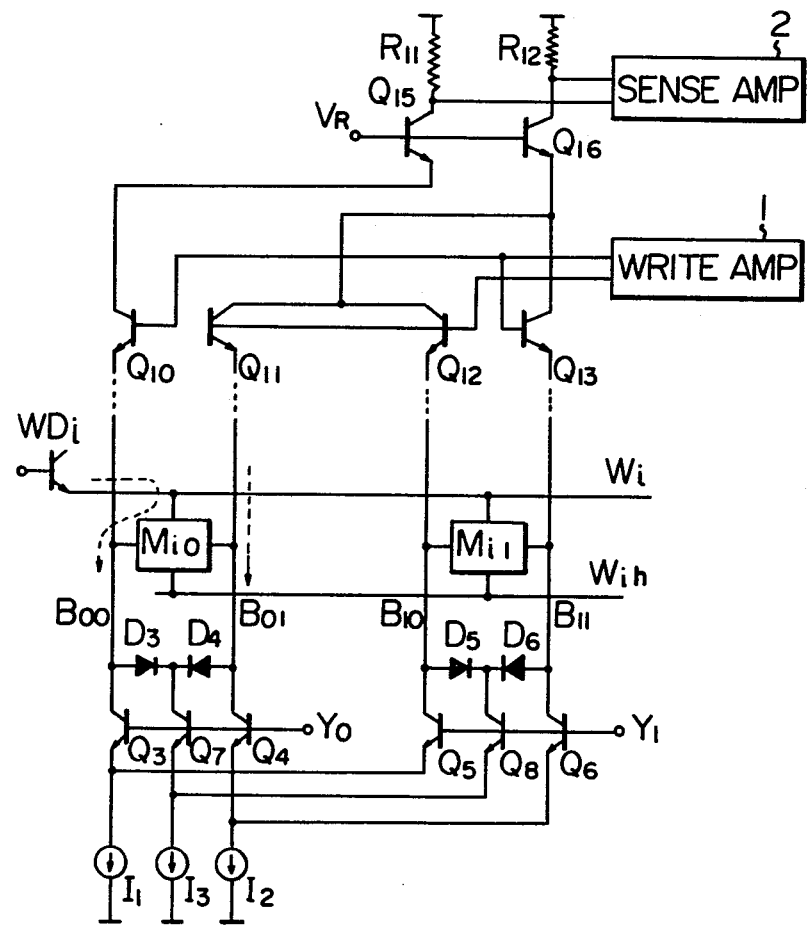
FIG. 4 is a block diagram of one embodiment of a static semiconductor memory according to the present invention.

The present invention is meant to solve this problem. FIG. 4 is the block diagram of one embodiment of the present invention. In FIG. 4, $M_{i0}$ and $M_{i1}$ represent a memory cell placed at i row and 0 column and a memory cell placed at i row and 1 column, respectively. Each memory cell has the same structure as that of the above-mentioned memory cells $M_{01}$, $M_{11}$, etc. $W_i$ designates a word line of row i, and $WD_i$ represents a driver for the word line $W_i$. In the present invention, diodes $D_3$ and $D_4$, $D_5$ and $D_6$, ... are connected to the paired bit lines $B_{00}$ and $B_{01}$, $B_{10}$ and $B_{11}$, ... with the polarity shown in the drawings, and common connection ends of these diodes are connected to a constant current source $I_3$ through transistors $Q_7$, $Q_8$, .... These diodes $D_3$ and $D_4$ or $D_5$ and $D_6$, ... form a current switch together with the constant current source $I_3$. Furthermore, the transistors $Q_7$, $Q_8$, ..., are controlled by column-selecting signals $Y_0$, $Y_1$, ... in the same way as the transistors $Q_3$ and $Q_4$, $Q_5$ and $Q_6$, ....

When the diodes $D_3$ and $D_4$, $D_5$ and $D_6$, ... are connected to the corresponding pairs of the bit lines so that current switches are formed as described above, if the level of one bit line becomes higher than the level of the other bit line at the time of selection of the column, the diode connected to the one bit line is turned on to inhibit elevation of the potential. Accordingly, in this embodiment, the level of the bit line $B_{10}$ is abruptly lowered, as indicated by the dotted line $B'_{10}$ in FIG. 3C, thereby preventing the case where the transistor $Q_{1b}$ is turned off and the transistor $Q_{2b}$ is turned on in the selected cell $M_{11}$.

The diodes $D_3$ and $D_4$, $D_5$ and $D_6$, ... absorb the current from the bit lines, in other words, discharge the stored charges in the bit lines, but this discharge is effected only when the corresponding column is selected by the transistors $Q_7$ and $Q_8$. The diodes are not actuated when the corresponding column is not selected. Accordingly, there is no problem of increase in the power consumption. Moreover, writing or reading is not disturbed at all. For example, in the case of reading, if the memory cell $M_{i0}$ is selected by maintaining the word line $W_i$ and column-selecting voltage $Y_0$ at high levels and by turning on the transistors $Q_3$ and $Q_4$, and in the memory cell $M_{i0}$, the left transistor (for example $Q_{1b}$ in FIG. 2) is in the "on" state while the right transistor (for example $Q_{2b}$ in FIG. 2) is in the "off" state, a current $I_1$ flows through $WD_i$, $W_i$, $M_{i0}$, $B_{00}$ and $Q_3$; and a current $I_2$ flows through the reading transistor $Q_{11}$, bit line $B_{01}$ and transistor $Q_4$, but no current flows in the reading transistor $Q_{10}$ (ordinarily, $I_1$ is equal to $I_2$). A sense amplifier 2 shown in FIG. 4 detects the electric current flows in the transistors $Q_{10}$ and $Q_{11}$, and a reading output is produced. In addition to the above-mentioned currents $I_1$ and $I_2$, a currents $I_3$ flows through $WD_i$, $M_{i0}$, $B_{00}$, $D_3$, and $Q_7$ in the present invention.

However, the current-flowing state of the transistor $Q_{10}$ or $Q_{11}$ is not influenced by this current $I_3$. Reading is accomplished by selecting the memory cell, for example, $M_{i0}$, in the same manner as described above, that is, by lowering the potential of the bit line $B_{01}$ to turn on the right transistor of the cell and elevating the potential of the bit line $B_{00}$ to turn off the left transistor of the cell (changes in the potentials of these bit lines occur according to the base potentials of the transistors $Q_{10}$ and $Q_{11}$). In the present embodiment, the current $I_3$ flows through the transistor $Q_{10}$ only when the level of one of the paired bit lines is lowered and, simultaneously, the level of the other bit line is elevated. Actuation and de-energization of the transistors and of the cell are not adversely affected by this current $I_3$.

Figure 5:
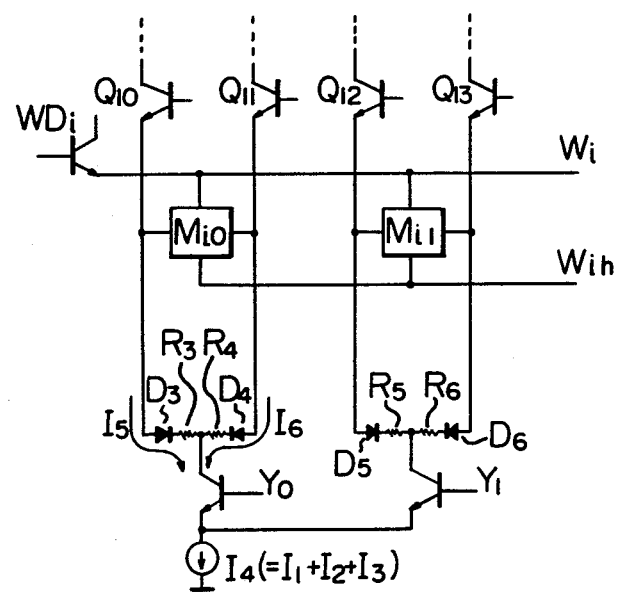
FIG. 5 is a block diagram of another embodiment of the static semiconductor memory according to the present invention.

FIG. 5 illustrates another embodiment of the present invention, in which resistors $R_3$, $R_4$ are connected to the diodes, and a current $I_4$ is divided into currents $I_5$ and $I_6$, whereby the same effect as that attained in the embodiment shown in FIG. 4 is attained. Incidentally, the values of the resistors $R_3$ and $R_4$ are determined so that relations of $I_5 = I_1 + I_3$ and $I_6 = I_2$ are established.

As will be apparent from the foregoing description, according to the present invention, occurrence of erroneous writing in a memory cell, which is likely to occur when reading is carried out by selecting the memory cell by changing word lines and column lines, can be prevented simply and assuredly. Therefore, the present invention is very advantagesous.

I claim:

1. A static semiconductor memory device operatively connected to receive a column selecting voltage, comprising:
   word lines;
   bit lines intersecting said word lines;
   static memory cells respectively connected to a pair of said word lines and a pair of said bit lines;
   a pair of unidirectional current elements connected to each said pair of said bit lines, each of said pair of unidirectional current elements having a first end connected to one of said pair of bit lines so as to absorb the electric current from said bit line, and having a second end;
   switching means, operatively connected to said second end of each of said pair of unidirectional current elements, for switching in dependence upon the column selecting voltage; and
   a constant current source operatively connected to said switching means.

2. A static semiconductor memory device according to claim 1, further comprising column-selecting transistors respectively connected between said bit lines and said constant current source,
   wherein each of said pair of unidirectional current elements comprises a diode,
   wherein said switching means comprises a transistor, and
   wherein said transistor is switched together with said column-selecting transistors.

3. A static semiconductor memory device according to claim 2, wherein said switching means further comprises a pair of resistors respectively connected between said second end of said pair of diodes and said transistor.

4. A static semiconductor memory device operatively connected to receive a column selecting voltage, comprising:
   first and second word lines;

first, second, third and fourth bit lines intersecting said first and second word lines;

a first static memory cell connected to said first and second word lines and said first and second bit lines;

a second static memory cell connected to said first and second word lines and said third and fourth bit lines;

a first unidirectional current element having a first end connected to said first bit line and having a second end;

a second unidirectional current element having a first end connected to said second bit line and having a second end connected to the second end of said first unidirectional current element at a first node;

a third unidirectional current element having a first end connected to said third bit line and having a second end;

a fourth unidirectional current element having a first end connected to said fourth bit line and having a second end connected to said third unidirectional current element at a second node, said first, second, third and fourth unidirectional current elements absorbing the electric current from said first, second, third and fourth bit lines, respectively;

first switching means, operatively connected to said first node, for switching in dependence upon the column selecting voltage;

second switching means, operatively connected to said second node, for switching in dependence upon the column selecting voltage; and a constant current source operatively connected to sad switching means.

5. A static semiconductor memory device according to claim 4, further comprising first, second, third and fourth column selecting transistors connected to said current source and respectively connected to said first, second, third and fourth bit lines, wherein said first, second, third and fourth unidirectional current elements comprise first, second, third and fourth diodes, wherein said first and second switching means comprise first and second transistors, respectively, wherein said first transistor is switched together with said first and second column selecting transistors, and wherein said second transistor is switched together with said third and fourth column selecting transistors.

6. A static semiconductor memory device according to claim 4, further comprising first and second resistors, respectively connected between the second ends of said first and second unidirectional current element and said first node, and third and fourth resistors respectively connected between the second ends of said third and fourth unidirectional current elements and said second node, wherein said first, second, third and fourth unidirectional current elements comprise first, second, third and fourth diodes, respectively.

* * * * *

UNITED STATES PATENT AND TRADEMARK OFFICE
CERTIFICATE OF CORRECTION

PATENT NO. : 4,456,979
DATED : JUNE 26, 1984
INVENTOR(S) : HIDEAKI ISOGAI

It is certified that error appears in the above-identified patent and that said Letters Patent is hereby corrected as shown below:

Col. 2, line 42, "cell" should be --cells--.

Col. 6, line 5, "sad" should be --said--.

Signed and Sealed this

Twenty-sixth Day of February 1985

[SEAL]

Attest:

DONALD J. QUIGG

Attesting Officer     Acting Commissioner of Patents and Trademarks